United States Patent
Son et al.

(10) Patent No.: US 12,074,260 B2
(45) Date of Patent: *Aug. 27, 2024

(54) DISPLAY DEVICE INCLUDING A PLURALITY OF THIN FILM TRANSISTORS WITH DIFFERENT CHARACTERISTICS

(71) Applicant: LG DISPLAY CO., LTD., Seoul (KR)

(72) Inventors: KyungMo Son, Gyeonggi-do (KR); ShunYoung Yang, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/144,594

(22) Filed: May 8, 2023

(65) Prior Publication Data

US 2023/0275195 A1 Aug. 31, 2023

Related U.S. Application Data

(63) Continuation of application No. 17/115,251, filed on Dec. 8, 2020, now Pat. No. 11,682,750.

(30) Foreign Application Priority Data

Dec. 31, 2019 (KR) .......................... 10-2019-0178836

(51) Int. Cl.
*H01L 27/14* (2006.01)
*H01L 27/15* (2006.01)
(Continued)

(52) U.S. Cl.
CPC .......... *H01L 33/486* (2013.01); *H01L 27/156* (2013.01); *H01L 29/7869* (2013.01);
(Continued)

(58) Field of Classification Search
CPC . H01L 33/486; H01L 27/156; H01L 29/7869; H01L 33/12; H01L 33/38;
(Continued)

(56) References Cited

U.S. PATENT DOCUMENTS 10,345,661 B2 * 7/2019 Miyake ................ G09G 3/3655
11,682,750 B2 * 6/2023 Son .......................... H01L 33/38
257/79

(Continued)

FOREIGN PATENT DOCUMENTS

| CN | 106783628 A | 5/2017 |
| CN | 107591410 A | 1/2018 |
| CN | 108257972 A | 7/2018 |

*Primary Examiner* — Tan N Tran
(74) *Attorney, Agent, or Firm* — Birch, Stewart, Kolasch & Birch, LLP

(57) ABSTRACT

A display device can include multiple layers, and a capacitor on the multiple layers. The capacitor can include one capacitor electrode and the other capacitor electrode, in which the one capacitor electrode is on a layer where a first gate electrode of a first thin film transistor is disposed on, and an electrode disposed on a layer where the other capacitor electrode is disposed on and made of same material with the other capacitor electrode overlaps a second thin film transistor. The display device can further include a first planarization layer and a second planarization layer on the first thin film transistor and the second thin film transistor, and a source electrode of the first thin film transistor between the first and second planarization layers.

20 Claims, 12 Drawing Sheets

(51) Int. Cl.
    *H01L 29/786*     (2006.01)
    *H01L 33/12*     (2010.01)
    *H01L 33/38*     (2010.01)
    *H01L 33/40*     (2010.01)
    *H01L 33/48*     (2010.01)
    *H01L 33/62*     (2010.01)

(52) U.S. Cl.
    CPC .............. *H01L 33/12* (2013.01); *H01L 33/38* (2013.01); *H01L 33/40* (2013.01); *H01L 33/62* (2013.01)

(58) Field of Classification Search
    CPC ..... H01L 33/40; H01L 33/62; H01L 27/1225; H01L 27/1248; H01L 27/1255; H01L 27/124; H01L 27/1251; H01L 27/13; H01L 29/786; H10K 59/1213; H10K 59/1216; H10K 50/846; G09G 3/3233; G02F 1/1368
    USPC .............................................. 257/79, 59, 72
    See application file for complete search history.

(56) References Cited

U.S. PATENT DOCUMENTS

| | | |
|---|---|---|
| 2015/0214256 A1 | 7/2015 | Miyairi |
| 2015/0255490 A1 | 9/2015 | Miyairi |
| 2015/0301422 A1 | 10/2015 | Miyake et al. |
| 2018/0033849 A1 | 2/2018 | Noh et al. |

\* cited by examiner

DISPLAY DEVICE INCLUDING A PLURALITY OF THIN FILM TRANSISTORS WITH DIFFERENT CHARACTERISTICS

CROSS REFERENCE TO RELATED APPLICATION

This application is a Continuation Application of U.S. patent application Ser. No. 17/115,251, filed on Dec. 8, 2020, which claims priority to Korean Patent Application No. 10-2019-0178836, filed in the Republic of Korea on Dec. 31, 2019, the entire contents of all these applications are hereby expressly incorporated by reference for all purposes as if fully set forth herein into the present application.

BACKGROUND OF THE INVENTION

1. Field of the Invention

The present disclosure relates to a display device.

2. Description of the Background Art

As the information society develops, the demand for display devices for displaying images is increasing in various forms. Various types of display devices such as a liquid crystal display device (LCD), and an organic light emitting display device (OLED) have been used for this purpose.

The display device can include a display panel in which various signal lines and a plurality of subpixels are disposed, and various driving circuits for driving various signal lines.

Each of the plurality of subpixels can include, for example, a light emitting element and a circuit element for driving the light emitting element. Further, the driving circuit can include circuit elements for outputting the driving signal.

Accordingly, the display device can include various circuit elements arranged in the subpixel or the driving circuit for driving the display. Here, the required characteristics can be different depending on the functions performed by the circuit elements included in the display device, and there may be a problem that it can be difficult or challenging to meet the characteristics required for each circuit element according to the process.

SUMMARY OF THE INVENTION

The embodiments of the present disclosure are directed to providing an improved display devide and method which address the above-identified limitations associated with the background art.

An aspect of embodiments of the present disclosure is to provide a method of improving driving characteristics of a switching transistor for controlling driving timing while improving driving characteristics of a driving transistor for controlling a driving current supplied to the light emitting element in the display device.

Another aspect of embodiments of the present disclosure is to provide a method that can simplify the process and meet the characteristics required for each circuit element disposed in the display device.

In accordance with an aspect of the present disclosure, there can be provided with a display device comprising: a plurality of first thin film transistors disposed on a substrate; at least one insulation layer disposed on the first thin film transistor; a plurality of second thin film transistors disposed on the insulation layer; and a capacitor electrode including a hydrogen adsorption layer disposed between at least some first thin film transistors among the plurality of first thin film transistors and the insulation layer and disposed on at least one of upper and lower surfaces of the capacitor electrode.

In accordance with another aspect of the present disclosure, there can be provided with a display device comprising: a plurality of first thin film transistors disposed on a substrate; a plurality of insulation layers located on the first thin film transistor; a plurality of second thin film transistors disposed on the insulation layer; a capacitor electrode disposed between at least some first thin film transistors of the plurality of first thin film transistors and the insulation layer; and a hydrogen adsorption layer positioned between two insulation layers of the plurality of insulation layers and disposed in a portion of a region overlapping the capacitor electrode.

In accordance with another aspect of the present disclosure, there can be provided with a display device comprising: a display panel in which a plurality of gate lines, a plurality of data lines, and a plurality of subpixels are disposed; a plurality of driving transistors disposed in each of the plurality of subpixels; a plurality of switching transistors disposed in each of the plurality of subpixels; and a capacitor electrode including a hydrogen adsorption layer overlapping at least a portion of a gate electrode of the driving transistor and disposed on at least one of an upper surface and a lower surface of the capacitor electrode.

According to the embodiments of the present invention, since the hydrogen adsorption layer is disposed on the driving transistor and not on the switching transistor, the S factor of the driving transistor can be increased and the S factor of the switching transistor can be decreased in the process.

According to the embodiments of the present invention, in a structure in which an oxide semiconductor thin film transistor is disposed on an upper layer of a low temperature polycrystalline silicon thin film transistor, the hydrogen adsorption layer is disposed on the capacitor electrode located on the driving transistor among low temperature polycrystalline silicon thin film transistors, so that it is possible to prevent the reduction of the S factor due to the re-hydrogenation of the driving transistor in the heat treatment process of the oxide semiconductor thin film transistor. In addition, the hydrogen adsorption layer is not disposed on the switching transistor, so that the S factor of the switching transistor can be reduced to provide driving characteristics required for each thin film transistor.

Therefore, it is possible to provide a method capable of satisfying the driving characteristics required for the driving transistor and the switching transistor without the additional process.

DETAILED DESCRIPTION OF THE EMBODIMENTS

Figure 1:
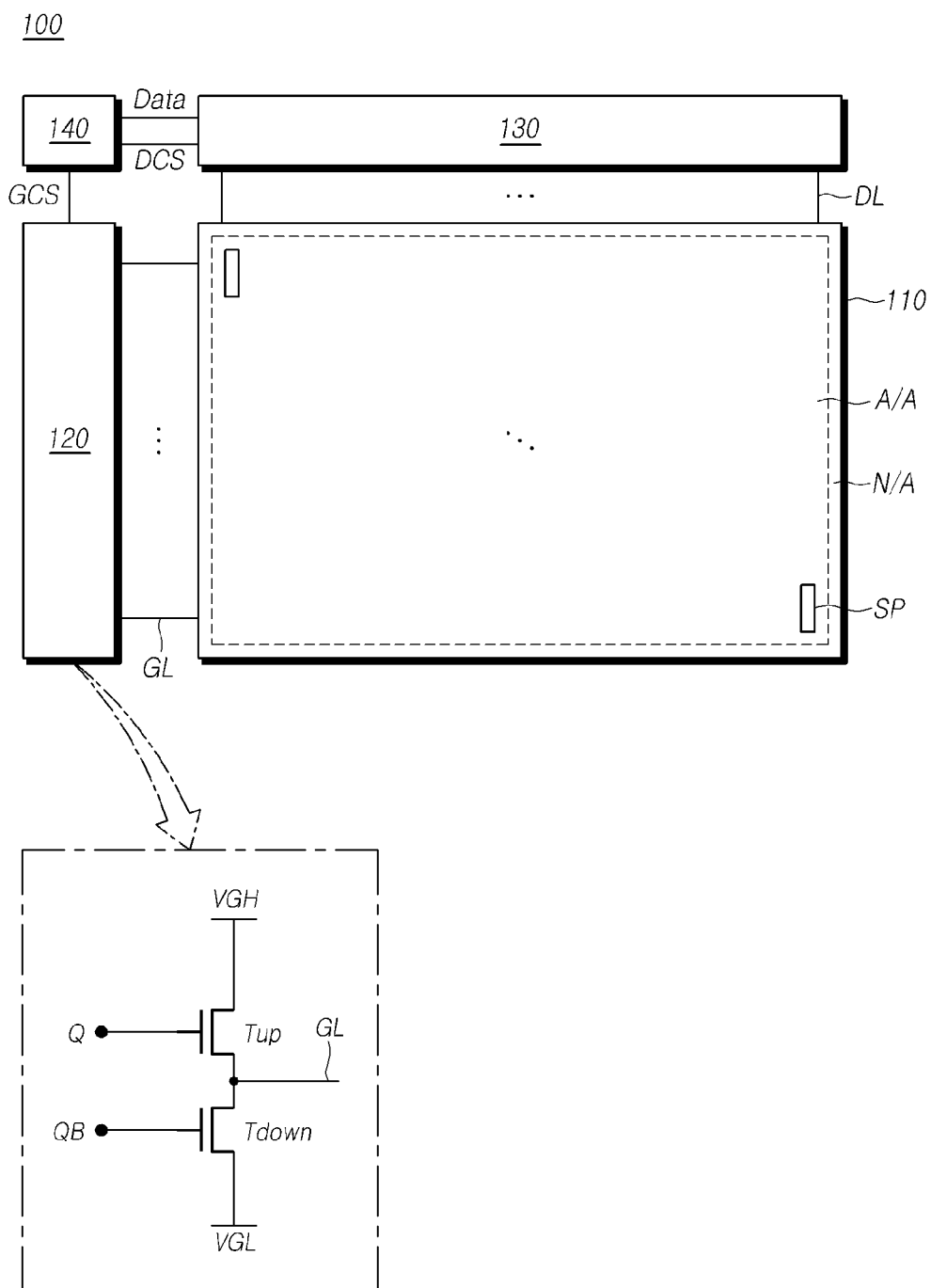
FIG. 1 is a diagram illustrating a schematic configuration of a display device according to embodiments of the present invention.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting", and "comprising" used herein are generally intended to allow other components to be added unless the terms are used with the term "only". As used herein, singular forms are intended to include plural forms unless the context clearly indicates otherwise.

Terms, such as "first", "second", "A", "B", "(a)", or "(b)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "overlaps" etc. a second element, it should be interpreted that, not only can the first element "be directly connected or coupled to" or "directly overlap" the second element, but a third element can also be "interposed" between the first and second elements, or the first and second elements can "be connected or coupled to", "overlap", etc. each other via a fourth element. Here, the second element can be included in at least one of two or more elements that "are connected or coupled to", "overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "can" fully encompasses all the meanings of the term "can". Further, in the below descriptions, when there exist a plurality elements, then any reference to "the element" can preferably mean "each or at least one of the elements".

FIG. 1 is a diagram illustrating a schematic configuration of a display device 100 according to embodiments of the present invention. All components of the display device according to all embodiments of the present invention are operatively coupled and configured.

Referring to FIG. 1, the display device 100 according to embodiments of the present invention can include a display panel 110 in which a plurality of subpixels SP are arranged, a gate driving circuit 120, a data driving circuit 130 and a controller 140 for driving the display panel 110. The display panel 110 can be divided into an active area A/A and a non-active area N/A surrounding the active area A/A.

In the display panel 110, a plurality of gate lines GL and a plurality of data lines DL can be disposed, and each subpixel SP can be located in an area where the gate lines GL and the data lines DL intersect. Each subpixel SP can include several circuit elements, and two or more subpixels SP can constitute one pixel.

The gate driving circuit 120 can be controlled by the controller 140 and sequentially output the scan signal to the plurality of gate lines GL disposed on the display panel 110, thereby controlling the driving timing of the plurality of subpixels SP.

In addition, the gate driving circuit 120 can output the light emission signal that controls the light emission timing of the subpixel SP. The circuit outputting the scan signal and the circuit outputting the light emission signal can be implemented integrally or separately.

The gate driving circuit 120 can include one or more gate driver integrated circuits (GDIC), and can be located on one side or both sides of the display panel 110 according to a driving method. Also, the gate driving circuit 120 can be implemented in the form of a GIP (Gate In Panel) disposed in the bezel area of the display panel 110.

The gate driving circuit 120 can include various circuit elements. For example, as illustrated in FIG. 1, the gate driving circuit 120 can include a pull-up transistor Tup and a pull-down transistor Tdown.

The pull-up transistor Tup can be controlled by the voltage level of a Q node, and controlled to output the gate high voltage VGH to the gate line GL. The pull-down transistor Tdown can be controlled by the voltage level of a QB node, and controlled to output the gate low voltage VGL to the gate line GL. The circuit structure of the gate driving circuit 120 shown in FIG. 1 is an example, and the gate driving circuit 120 can further include various circuit elements in addition to the pull-up transistor Tup and the pull-down transistor Tdown according to types.

The data driving circuit 130 can receive image data Data from the controller 140 and convert the image data Data to the data voltage in analog form. Then, the data driving circuit 130 outputs the data voltage to each data line DL according to the timing at which the scan signal is applied through the gate line GL, thereby each subpixel SP can express brightness according to image data.

The data driving circuit 130 can include one or more source driver integrated circuits (SDICs). Also, the data driving circuit 130 can be located on only one side of the display panel 110 or can be located on both sides according to the driving manner.

The controller 140 can supply various control signals to the gate driving circuit 120 and the data driving circuit 130, and can control the operation of the gate driving circuit 120 and the data driving circuit 130.

The controller 140 can allow the gate driving circuit 120 to output the scan signal according to the timing implemented in each frame. In addition, the controller 140 can convert the image data received from the outside according to the data signal format used by the data driving circuit 130 and can output the converted image data to the data driving circuit 130.

The controller 140 can receive various timing signals including the vertical synchronization signal VSYNC, the horizontal synchronization signal HSYNC, the input data enable signal DE and the clock signal CLK together with image data from the outside (e.g., host system).

The controller 140 can generate various control signals using various timing signals received from the outside and output the control signals to the gate driving circuit 120 and the data driving circuit 130.

For example, in order to control the gate driving circuit 120, the controller 140 can output various gate control signals GCS including the gate start pulse GSP, the gate shift clock GSC and the gate output enable signal GOE.

Here, the gate start pulse GSP can control the operation start timing of one or more gate driver integrated circuits constituting the gate driving circuit 120. The gate shift clock GSC is a clock signal commonly input to one or more gate driver integrated circuits, and controls the shift timing of the scan signal. The gate output enable signal GOE can specify timing information of one or more gate driver integrated circuits.

In addition, the controller 140, in order to control the data driving circuit 130, can output various data control signals DCS including the source start pulse SSP, the source sampling clock SSC, the source output enable signal SOE and so on.

Here, the source start pulse SSP controls the data sampling start timing of one or more source driver integrated circuits constituting the data driving circuit 130. The source sampling clock SSC is a clock signal that controls the sampling timing of data in each of the source driver integrated circuits. The source output enable signal SOE controls the output timing of the data driving circuit 130.

The display device 100 can further include a power management integrated circuit that supplies various voltages or currents to the display panel 110, the gate driving circuit 120, and the data driving circuit 130, or controls various voltages or currents to be supplied.

In addition, the voltage lines to which various signals or voltages are supplied can be disposed on the display panel 110 in addition to the gate line GL and the data line DL.

In addition, various circuit elements for driving the subpixel SP can be disposed in each subpixel SP.

Figure 2:
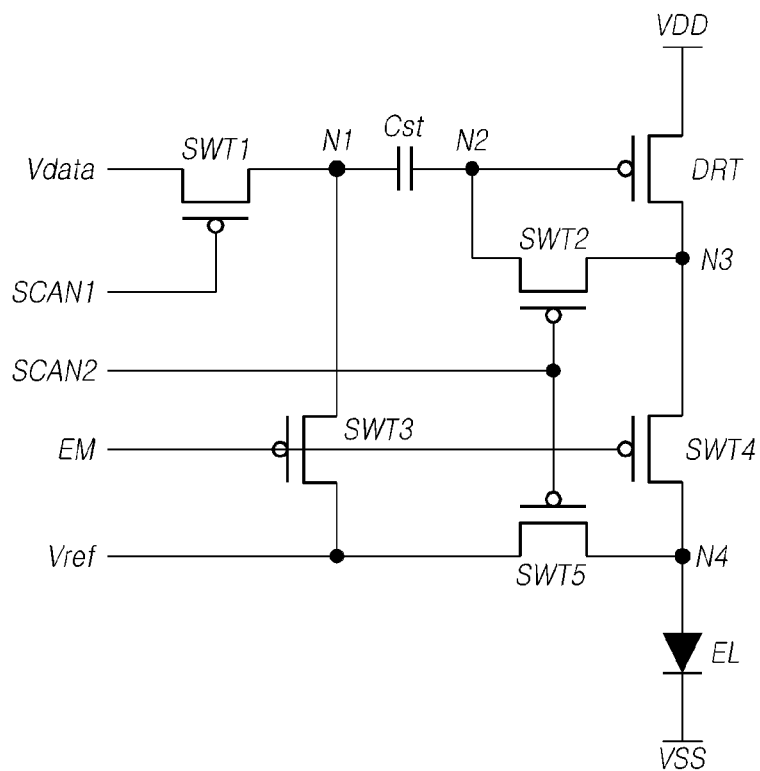
FIG. 2 is a diagram illustrating an example of the circuit structure and the driving method of the subpixel disposed in the display device according to embodiments of the present invention.
Figure 2:
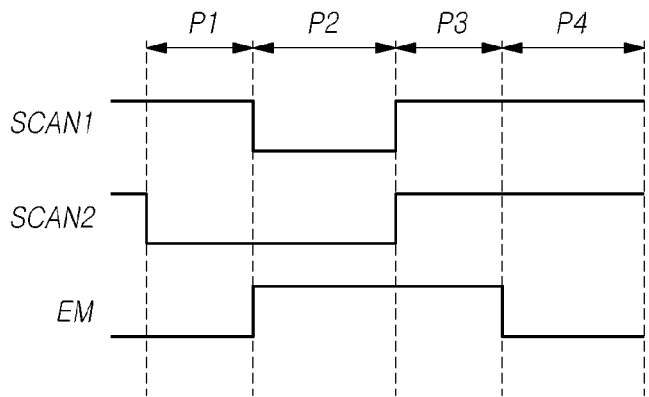

FIG. 2 is a diagram illustrating an example of the circuit structure and the driving method of the subpixel SP disposed in the display device 100 according to embodiments of the present invention. For example, each or at least one of the subpixels SP can have the configuration shown in FIG. 2.

Referring to FIG. 2, a light emitting element EL can be disposed in the subpixel SP. In addition, circuit elements such as a plurality of thin film transistors TFT and the capacitor Cst for driving the light emitting element EL can be disposed in the subpixel SP.

The plurality of thin film transistors TFT can include one or more switching transistors SWT and one or more driving transistors DRT.

The example of FIG. 2 illustrates a 6T1C structure in which six thin film transistors TFTs and one capacitor Cst are arranged as an example, but the circuit elements constituting the subpixel SP can be arranged differently according to the type of the display device 100. Here, the six thin film transistors can be first to fifth switching transistors SWT1 to SWT5 and a driving transistor DRT.

In addition, FIG. 2 illustrates an example in which the thin film transistor TFT disposed in the subpixel SP is of the P type, but the N type thin film transistor TFT can be used in some cases.

The first switching transistor SWT1 can be electrically connected between the data line DL to which the data voltage Vdata is supplied and a first node N1. The first switching transistor SWT1 can be controlled by a first scan signal SCAN1. Then, the first switching transistor SWT1 can control the supply of the data voltage Vdata to the first node N1.

The second switching transistor SWT2 can be electrically connected between a second node N2 and a third node N3. The second switching transistor SWT2 can be controlled by a second scan signal SCAN2.

The third switching transistor SWT3 can be electrically connected between the first node N1 and a reference voltage line to which the reference voltage Vref is supplied. The third switching transistor SWT3 can be controlled by a light emission signal EM. Then, the third switching transistor SWT3 can control the supply of the reference voltage Vref to the first node N1.

The fourth switching transistor SWT4 can be electrically connected between the third node N3 and a fourth node N4. The fourth switching transistor SWT4 can be controlled by the light emission signal EM.

The fifth switching transistor SWT5 can be electrically connected between the fourth node N4 and the reference voltage line to which the reference voltage Vref is supplied. The fifth switching transistor SWT5 can be controlled by the second scan signal SCAN2.

The driving transistor DRT can be controlled by the voltage of the second node N2, and can control the supply of the first driving voltage VDD. Here, the first driving voltage VDD can be a high potential voltage for driving the subpixel SP.

The capacitor Cst can be electrically connected between the first node N1 and the second node N2, and can operate to maintain the data voltage Vdata during the period in which the light emitting element EL emits light.

The light emitting element EL can be, for example, an organic light emitting diode (OLED), and the anode electrode can be connected to the fourth node N4, and the second driving voltage VSS can be applied to the cathode electrode. Here, the second driving voltage VSS can be a low potential voltage for driving the subpixel SP.

Referring to the driving timing illustrated in FIG. 2, in a state in which the light emission signal EM is at a low level in the first period P1, the second scan signal SCAN2 in the low level can be applied.

Accordingly, in the state in which the third switching transistor SWT3 and the fourth switching transistor SWT4 are turned on in the first period P1, the second switching transistor SWT2 and the fifth switching transistor SWT5 can be turned on. In addition, the first node N1, the second node N2, the third node N3 and the fourth node N4 can be initialized to the reference voltage Vref.

In a state in which the second scan signal SCAN2 is at the low level in the second period P2, the first scan signal SCAN1 at a low level and the light emission signal EM at a high level can be applied.

Accordingly, the first switching transistor SWT1 can be turned on, and the third switching transistor SWT3 and the fourth switching transistor SWT4 can be turned off.

Since the first switching transistor SWT1 is turned on, the data voltage Vdata can be applied to the first node N1.

In addition, since the second switching transistor SWT2 is turned on, the second node N2 and the third node N3 are electrically connected. Accordingly, in the second period P2, a voltage at which the threshold voltage of the driving transistor DRT is reduced from the first driving voltage VDD can be applied to the second node N2. For example, during the second period P2, the application of the data voltage Vdata and the compensation of the threshold voltage of the driving transistor DRT can be performed.

In the state in which the light emission signal EM is at the high level in the third period P3, the first scan signal SCAN1 at a high level and the second scan signal SCAN2 at a high level can be applied. Therefore, the first node N1 and the second node N2 can be floated.

In a state in which the first scan signal SCAN1 and the second scan signal SCAN2 are at a high level in the fourth period P4, the light emission signal EM at the low level can be applied.

Since the light emission signal EM at the low level is supplied, the third switching transistor SWT3 and the fourth switching transistor SWT4 controlled by the light emission signal EM can be turned on. In addition, a driving current according to the data voltage Vdata is supplied to the light emitting element EL, and the light emitting element EL can represent brightness according to the data voltage Vdata.

The circuit structure of the subpixel SP can vary according to the type of the display device 100, as described above.

For example, the gate line GL controlling the first switching transistor SWT1 and the gate line GL controlling the second switching transistor SWT2 and the fifth switching transistor SWT5 can be the same. For example, the first scan signal SCAN1 and the second scan signal SCAN2 are not separately supplied to the subpixel SP, but the first switching transistor SWT1, the second switching transistor SWT2, and the fifth switching transistor SWT5 can be simultaneously controlled by one scan signal.

Alternatively, the subpixel SP can have a circuit structure of 7T1C in which six switching transistors SWT, one driving transistor DRT, and one capacitor Cst are disposed in the subpixel SP.

In this way, the circuit element can be arranged in various forms on the subpixel SP. In addition, it can be arranged in various types in the sub-pixel SP or the display device 100 according to the function provided by the circuit element.

Figure 3:
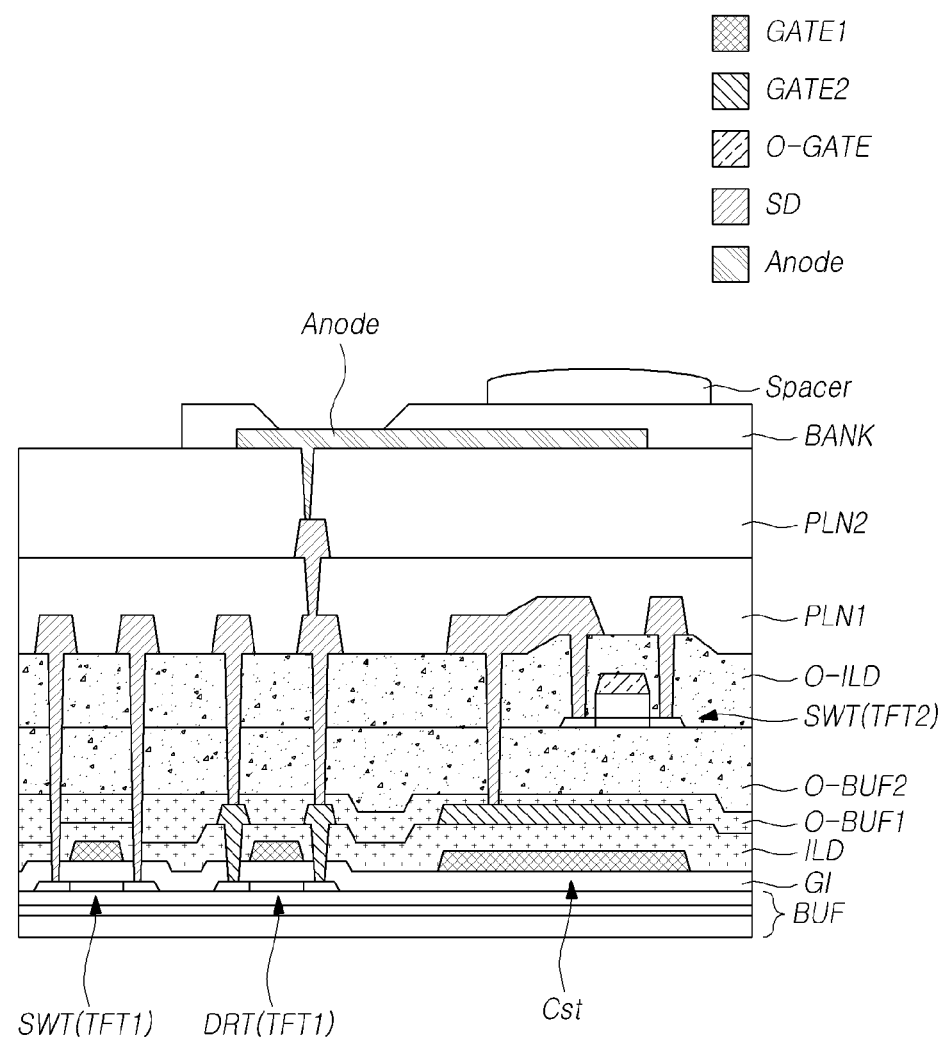
FIG. 3 is a diagram illustrating an example of a cross-sectional structure of a region in which the thin film transistors included in the display device according to embodiments of the present invention are disposed.

FIG. 3 is a diagram illustrating an example of a cross-sectional structure of a region in which the thin film transistors TFT included in the display device 100 according to embodiments of the present invention are disposed.

Referring to FIG. 3, a buffer layer BUF can be disposed on a substrate, and a plurality of first thin film transistors TFT1 can be disposed on the buffer layer BUF. The first thin film transistor TFT1 can include, for example, an active layer made of polycrystalline silicon. Also, the first thin film transistor TFT1 can include a gate electrode made of a first gate metal GATE1 and a source electrode and drain electrode made of a second gate metal GATE2.

The insulation layer such as the gate insulation layer GI or the interlayer insulation layer ILD can be disposed between components of the first thin film transistor TFT1.

Some of the plurality of first thin film transistors TFT1 can be the driving transistor DRT disposed in the subpixel SP. When the first thin film transistor TFT1 is the driving transistor DRT, the source electrode or drain electrode of the driving transistor DRT can be electrically connected to the anode electrode of the light emitting element EL through the source/drain metal SD or the like.

A portion of the plurality of first thin film transistors TFT1 can be the switching transistor SWT disposed in the subpixel SP or the driving circuit such as the gate driving circuit 120.

The capacitor Cst made of the first gate metal GATE1 and the second gate metal GATE2 can be disposed on the layer on which the first thin film transistor TFT1 is disposed.

In addition, at least one insulation layer can be disposed on the first thin film transistor TFT1, and the second thin film transistor TFT2 of a different type from the first thin film transistor TFT1 can be disposed.

The second thin film transistor TFT2 can include, for example, an active layer made of an oxide semiconductor. In addition, the second thin film transistor TFT2 can include the gate electrode made of an oxide gate metal O-GATE and a source electrode and drain electrode made of a source/drain metal SD. The oxide gate metal O-GATE can be the same material as the first gate metal GATE1 or the second gate metal GATE2, or can be a different material.

The second thin film transistor TFT2 can be the switching transistor SWT.

At least one oxide buffer layer O-BUF can be disposed between the first thin film transistor TFT1 and the second thin film transistor TFT2. For example, a first oxide buffer layer O-BUF1 and a second oxide buffer layer O-BUF2 can be disposed between the first thin film transistor TFT1 and the second thin film transistor TFT2. In addition, the first oxide buffer layer O-BUF1 and the second oxide buffer layer O-BUF2 can be made of different materials.

For example, the first oxide buffer layer O-BUF1 can be made of SiNx in the same manner as the interlayer insulation layer ILD. In addition, the second oxide buffer layer O-BUF2 can be made of $SiO_2$ in the same manner as the oxide insulation layer O-ILD.

On the second thin film transistor TFT2, a first planarization layer PLN1, a second planarization layer PLN2, a bank BANK, a spacer and the like can be disposed.

As described above, according to embodiments of the present invention, the first thin film transistor TFT1 made of low-temperature polycrystalline silicon and the second thin film transistor TFT2 made of oxide semiconductor can be disposed on different layers, thereby the thin film transistors TFT having different driving characteristics can be disposed on the display device 100.

In the embodiments of the present invention, according to the function provided by the first thin film transistor TFT1, a material adsorbing hydrogen can be disposed on the first thin film transistor TFT1, so that the first thin film transistor TFT1 of the same type can have different driving characteristics.

Figure 4:
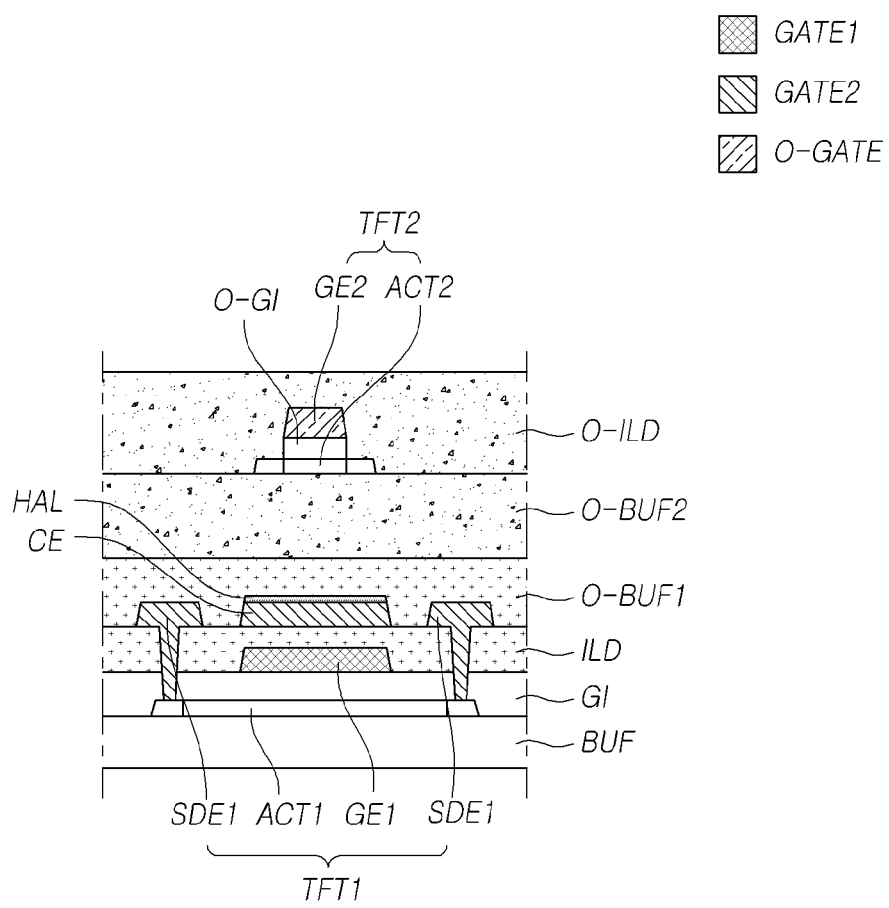
FIG. 4 is a diagram illustrating an example of a cross-sectional structure of a region in which the driving transistor is disposed among thin film transistors included in the display device according to embodiments of the present invention.

FIG. 4 is a diagram illustrating an example of a cross-sectional structure of a region in which the driving transistor DRT is disposed among thin film transistors TFT included in the display device 100 according to embodiments of the present invention.

Referring to FIG. 4, the first thin film transistor TFT1 can be disposed on the buffer layer BUF. The second thin film transistor TFT2 can be disposed on an upper layer than the first thin film transistor TFT1.

At least one insulation layer can be disposed between the first thin film transistor TFT1 and the second thin film transistor TFT2. For example, the first oxide buffer layer O-BUF1 and the second oxide buffer layer O-BUF2 can be disposed on the first thin film transistor TFT1 and the second thin film transistor TFT2. In addition, the first oxide buffer layer O-BUF1 can be made of SiNx, and the second oxide buffer layer O-BUF2 can be made of $SiO_2$.

The first thin film transistor TFT1 can include a first active layer ACT1, a first gate electrode GE1, and a first source electrode and drain electrode SDE1. Here, the first active layer ACT1 can be made of polycrystalline silicon.

The plurality of first thin film transistors TFT1 can be included in the display device 100, and the capacitor electrode CE can be positioned on some of the first thin film transistors TFT1 among the plurality of first thin film transistors TFT1.

The capacitor electrode CE can be positioned on the first gate electrode GE1 of the first thin film transistor TFT1. The capacitor electrode CE can be formed of the second gate metal GATE2 constituting the first source electrode and drain electrode SDE1 of the first thin film transistor TFT1.

The first thin film transistor TFT1 in which the capacitor electrode CE is disposed on the first gate electrode GE1 can be the driving transistor DRT disposed in the subpixel SP. For example, the first gate electrode GE1 and the capacitor electrode CE can form the capacitor Cst disposed in the subpixel SP.

Here, the hydrogen adsorption layer HAL can be disposed on at least a portion of the upper surface of the capacitor electrode CE.

The hydrogen adsorption layer HAL can be made of a material different from the material constituting the capacitor electrode CE. For example, the capacitor electrode CE can be made of Mo, Al, or alloys thereof. In addition, the hydrogen adsorption layer HAL can be formed of a material having stable properties of bonding with hydrogen, such as Ti, V, Mg, and La.

The hydrogen adsorption layer HAL can be disposed in at least a portion of the capacitor electrode CE, and may not be disposed in a region other than the capacitor electrode CE. In addition, the hydrogen adsorption layer HAL may not be disposed on the first gate electrode GE1 of the first thin film transistor TFT1. For example, the first gate electrode GE1 can be made of a material other than the material constituting the hydrogen adsorption layer HAL.

The hydrogen adsorption layer HAL disposed on the capacitor electrode CE can adjust the amount of hydrogen contained in the first active layer ACT1 of the first thin film transistor TFT1 during the heat treatment process.

Therefore, the hydrogen adsorption layer HAL can control the driving characteristics of the first thin film transistor TFT1, so that the first thin film transistor TFT1 has different driving characteristics depending on whether the hydrogen adsorption layer HAL is disposed.

Figure 5:
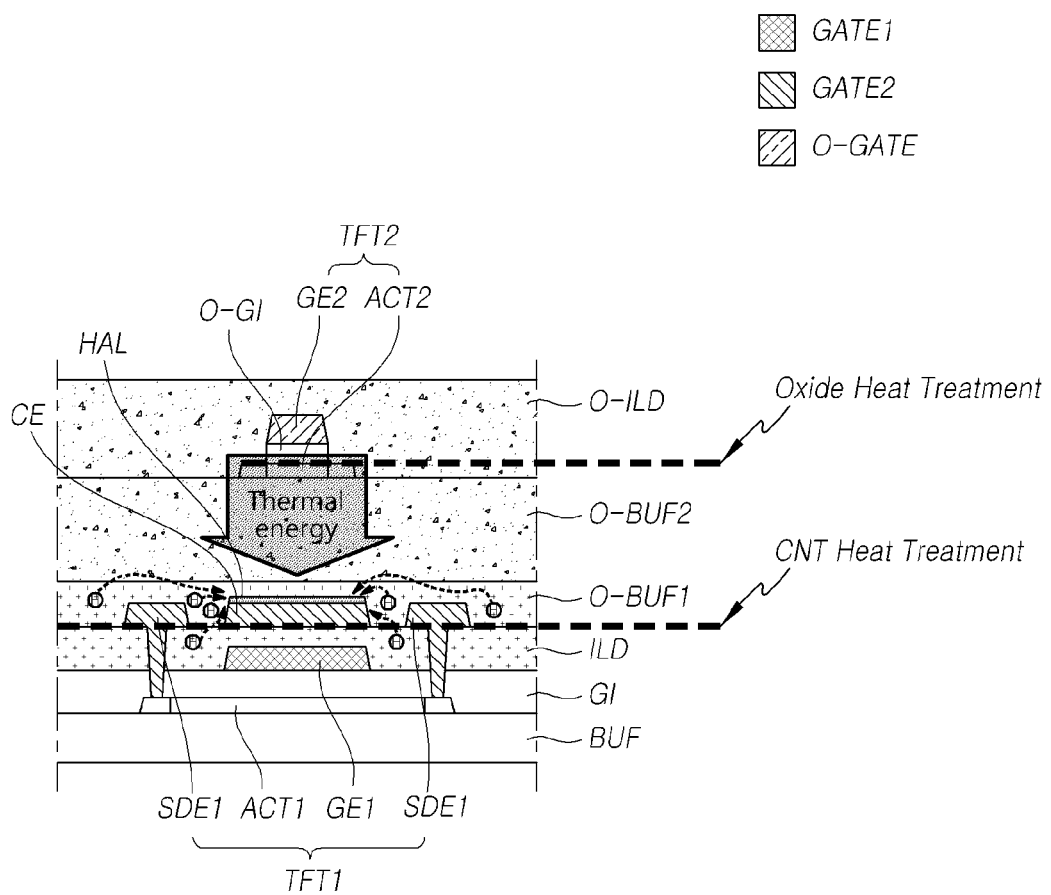
FIG. 5 is a diagram illustrating an example of the change in characteristics of the driving transistor in FIG. 4 during the process.

FIG. 5 is a diagram illustrating an example of the change in characteristics of the driving transistor DRT in FIG. 4 during the process.

Referring to FIG. 5, the first active layer ACT1, the gate insulation layer GI, the first gate electrode GE1, and the interlayer insulation layer ILD are sequentially disposed, and a hydrogenation process of the first active layer ACT1 can be performed. Thereafter, a contact hole CNT for disposing the first source electrode and drain electrode SDE1 is formed, and a heat treatment process of the contact hole CNT can be performed.

After the heat treatment process of the contact hole CNT, the capacitor electrode CE and the first source electrode and drain electrode SDE1 can be disposed.

At this time, the hydrogen adsorption layer HAL can be disposed on the capacitor electrode CE. The hydrogen adsorption layer HAL can be disposed on the capacitor electrode CE using a halftone mask method in the process of forming the capacitor electrode CE. Therefore, the hydrogen adsorption layer HAL can be disposed without adding a separate process.

When the arrangement of the capacitor electrode CE is completed, the first oxide buffer layer O-BUF1 and the second oxide buffer layer O-BUF2 can be disposed. In addition, the second active layer ACT2 made of the oxide semiconductor can be disposed, and the oxide gate insulation layer O-GI, the second gate electrode GE2 and the oxide insulation layer O-ILD can be disposed.

Here, the second active layer ACT2 and the oxide gate insulation layer O-GI are disposed, and the heat treatment process can be performed.

After the heat treatment of the contact hole CNT formed in the interlayer insulation layer ILD, the hydrogen content of the first oxide buffer layer O-BUF1 can be increased due to the deposition of the first oxide buffer layer O-BUF1. In addition, as heat energy is applied to the first oxide buffer layer O-BUF1 by the heat treatment process for the second active layer ACT2, hydrogen included in the first oxide buffer layer O-BUF1 can move to the outside.

Hydrogen moved from the first oxide buffer layer O-BUF1 can be collected by the hydrogen adsorption layer HAL disposed on the capacitor electrode CE. Therefore, it is possible to prevent hydrogen contained in the first oxide buffer layer O-BUF1 from being transferred to the first active layer ACT1 during the heat treatment process for the second active layer ACT2 and the like.

For example, after the hydrogenation process for the first active layer ACT1, it is possible to prevent the re-hydrogenation of the first active layer ACT1 by hydrogen generated during the heat treatment process. In addition, by preventing re-hydrogenation of the first active layer ACT1, it is possible to prevent the S factor of the first thin film transistor TFT1 from being reduced.

In this way, the hydrogen adsorption layer HAL is disposed on the capacitor electrode CE positioned on the first thin film transistor TFT1, thereby preventing the reduction of the S factor of the first thin film transistor TFT1 during the heat treatment process. As a result, it is possible to provide driving characteristics of the first thin film transistor TFT1 as the driving transistor DRT that requires high driving current generation performance.

In addition to the driving transistor DRT, in the switching transistor SWT disposed in the subpixel SP or the gate driving circuit 120, turn-on and turn-off performance is made at a required timing. Therefore, according to the present embodiment, the driving characteristics of the first thin film transistor TFT1 used as the switching transistor SWT can be improved by reducing the S factor during the heat treatment process.

Figure 6:
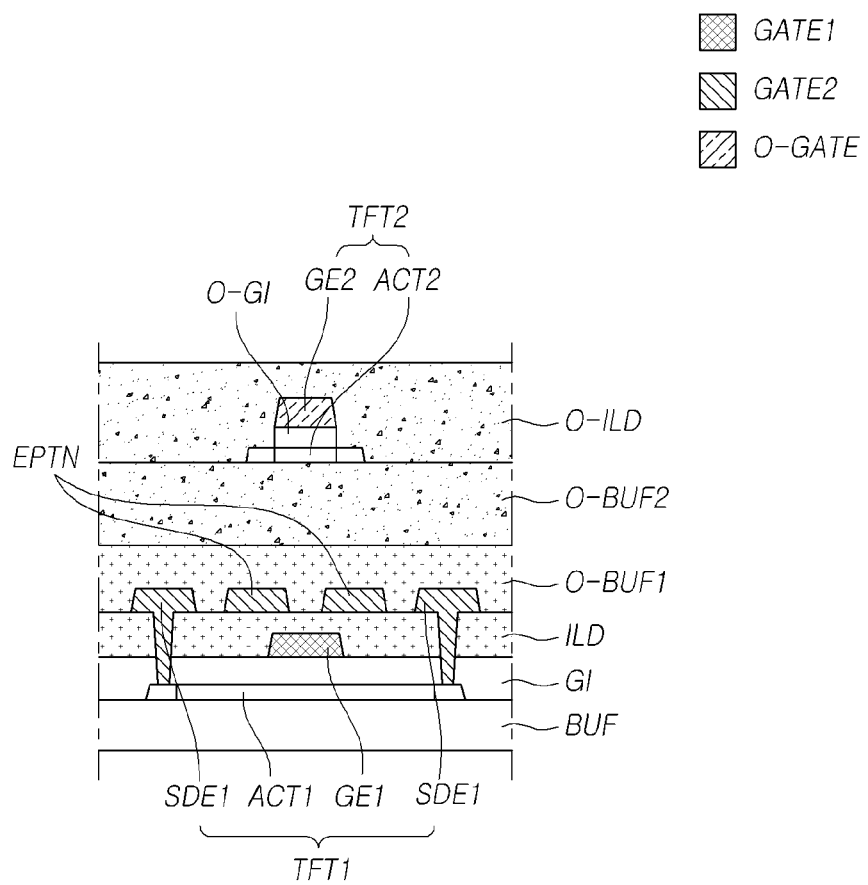
FIG. 6 is a diagram illustrating an example of a cross-sectional structure of a region in which the switching transistor is disposed among thin film transistors included in the display device according to embodiments of the present invention.

FIG. 6 is a diagram illustrating an example of a cross-sectional structure of a region in which the switching transistor SWT is disposed among thin film transistors included in the display device 100 according to embodiments of the present invention. Furthermore, FIG. 7 is a diagram illustrating an example of the change in characteristics of the switching transistor SWT in FIG. 6 during a process.

Here, the switching transistor SWT can include the switching transistor SWT disposed in the subpixel SP or the pull-up transistor Tup or a pull-down transistor Tdown disposed in the gate driving circuit 120. For example, the switching transistor SWT can preferably mean the first thin film transistor TFT1 that is included in the display device 100 and controls driving timing in addition to the driving transistor DRT.

Figure 7:
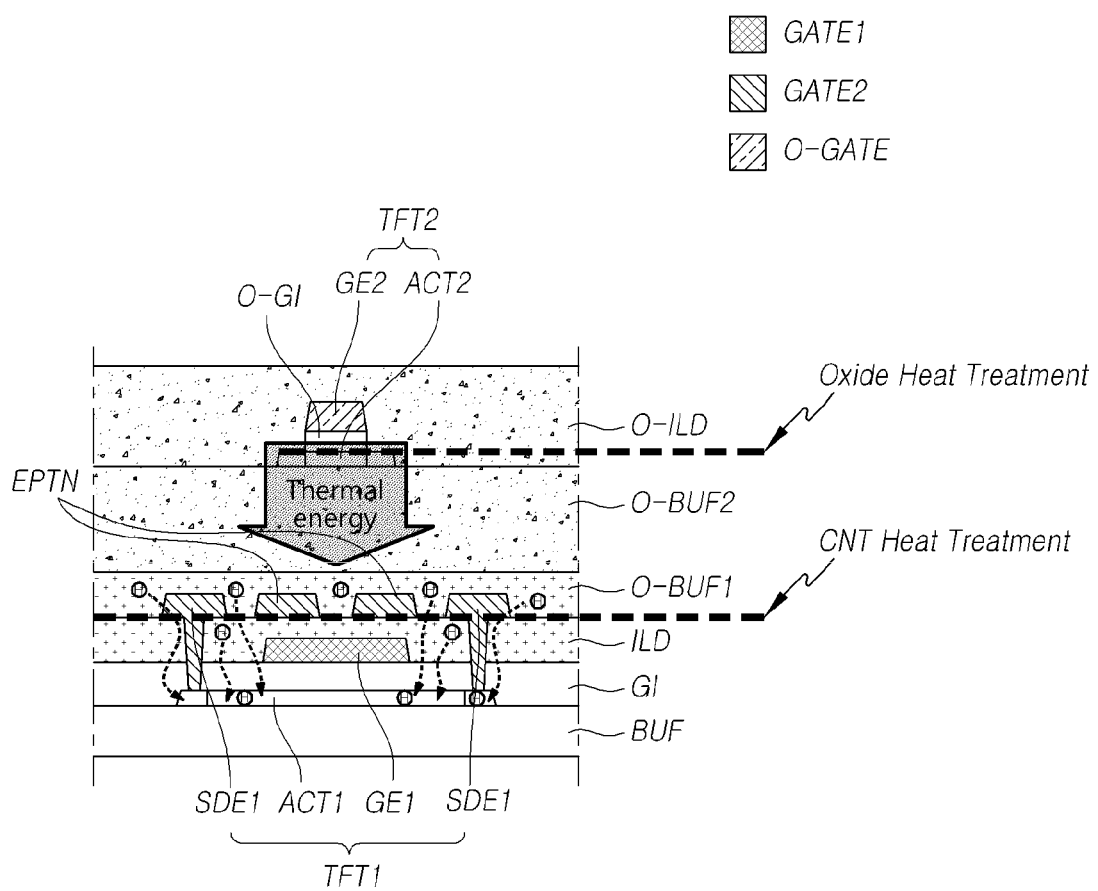
FIG. 7 is a diagram illustrating an example of the change in characteristics of the switching transistor in FIG. 6 during a process.

Referring to FIGS. 6 and 7, the first oxide buffer layer O-BUF1 and the second oxide buffer layer O-BUF2 can be disposed on the first thin film transistor TFT1. In addition, the second thin film transistor TFT2 can be disposed on a layer higher than the second oxide buffer layer O-BUF2.

At least one electrode pattern EPTN can be disposed on the first gate electrode GE1 of the first thin film transistor TFT1. Alternatively, in some cases, the electrode pattern EPTN may not be positioned on the first thin film transistor TFT1.

The electrode pattern EPTN can be, for example, a part of the signal lines disposed in the subpixel SP or the gate driving circuit 120 or the like. Alternatively, the electrode pattern EPTN can be a portion in which the capacitor electrode CE disposed on the driving transistor DRT is extended. For example, the electrode pattern EPTN can be a part of a signal lines or the capacitor electrode CE.

The electrode pattern EPTN can be formed of a material except for the material constituting the hydrogen adsorption layer HAL disposed on the capacitor electrode CE. For example, the electrode pattern EPTN can be made of Mo, Al, etc., which is the second gate metal GATE2 that is the same as the first source electrode and drain electrode SDE1, and may not include a material having hydrogen adsorption characteristics such as Ti.

Since the hydrogen adsorption layer HAL is not positioned on the first thin film transistor TFT1 used as the switching transistor SWT, re-hydrogenation of the first active layer ACT1 can be performed during the heat treatment process. In addition, the S factor of the first thin film transistor TFT1 can be reduced by re-hydrogenation of the first active layer ACT1.

Since the S factor of the first thin film transistor TFT1 is reduced, it can be easy to control turn-on and turn-off of the first thin film transistor TFT1. Accordingly, driving characteristics of the first thin film transistor TFT1 used as the switching transistor TFT1 can be improved.

In embodiments of the present invention, in the structure in which the same type of first thin film transistor TFT1 is disposed, the degree of hydrogenation of the first thin film transistor TFT1 can be controlled by the arrangement of the hydrogen adsorption layer HAL and the heat treatment process. Accordingly, it is possible to provide a method capable of satisfying all of the driving characteristics of the driving transistor DRT controlling the driving current supplied to the light emitting element EL and the driving characteristics of the switching transistor SWT controlling the driving timing among the plurality of first thin film transistor TFT1.

In particular, in the subpixel SP in which both the driving transistor DRT and the switching transistor SWT are disposed, the driving characteristics required for each thin film transistor TFT can be satisfied by the arrangement structure of the hydrogen adsorption layer HAL.

Figure 8:
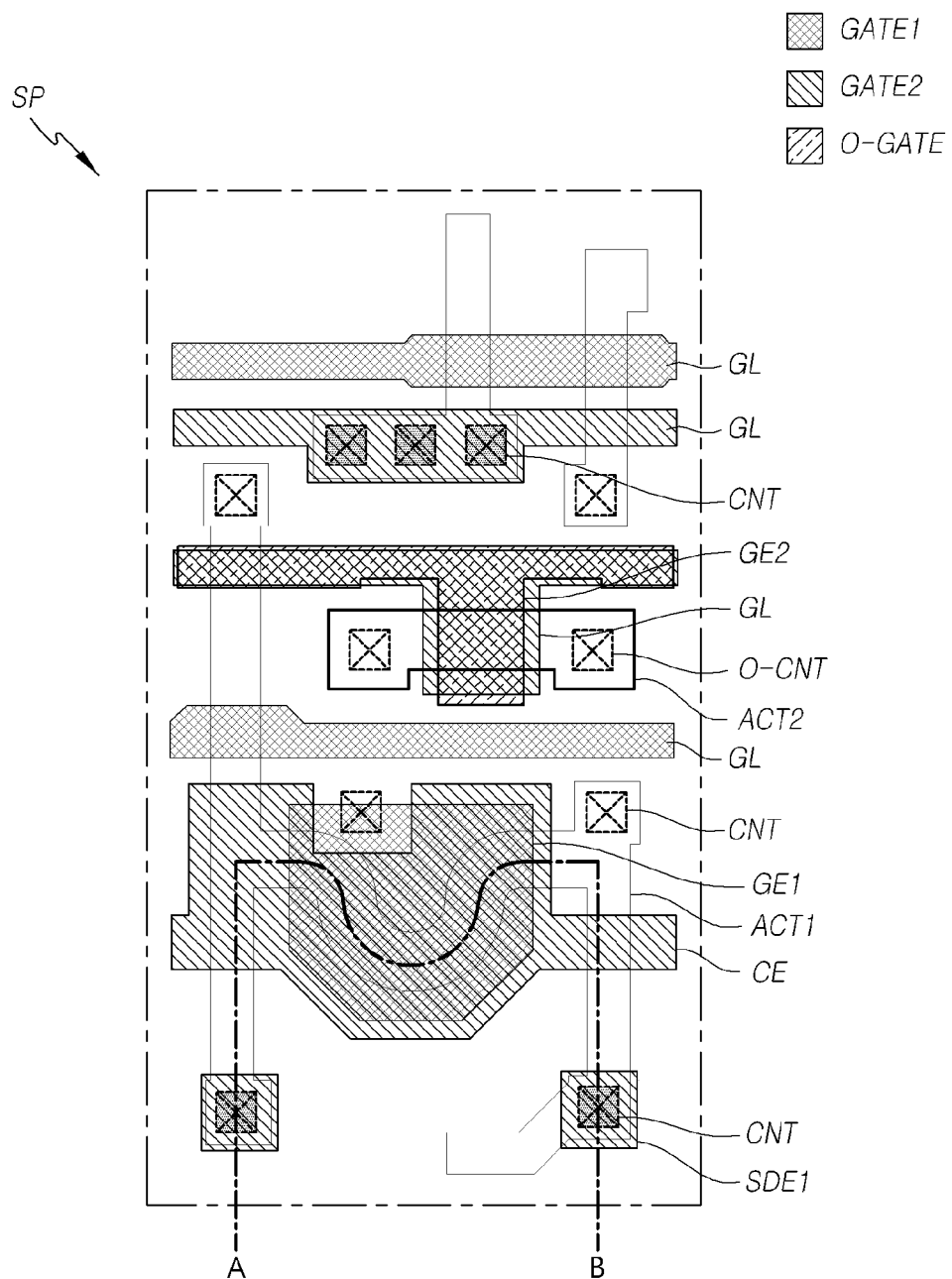
FIG. 8 is a diagram illustrating an example of a planar structure in which the thin film transistor included in the display device according to embodiments of the present invention is disposed in the subpixel.

FIG. 8 is a diagram illustrating an example of a planar structure in which the thin film transistor TFT included in the display device 100 according to embodiments of the present invention is disposed in the subpixel SP. Also, FIG. 9 is a diagram illustrating an example of a cross-sectional structure of the portion along line A-B shown in FIG. 8.

As shown in FIG. 8 illustrating an example of a schematic structure of a subpixel SP, at least one gate line GL to which the scan signal for controlling the switching transistor SWT disposed in the subpixel SP is applied can be disposed.

Figure 9:
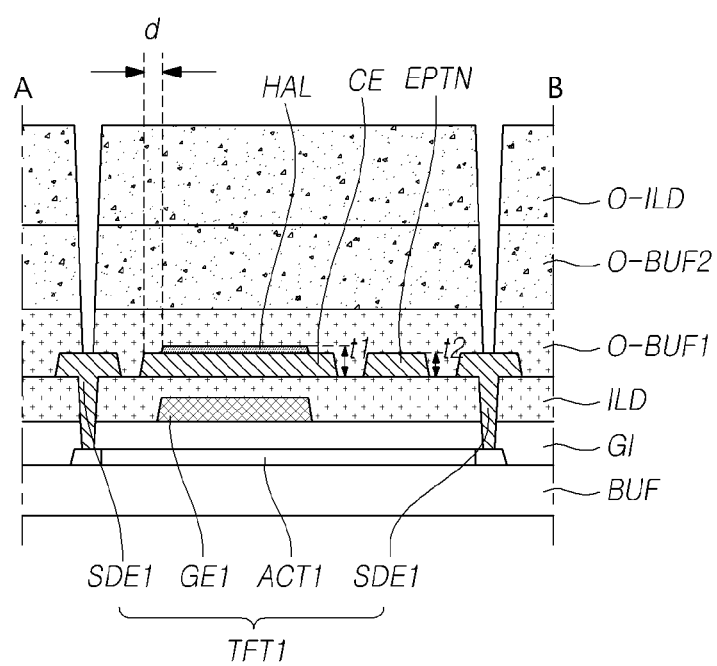
FIG. 9 is a diagram illustrating an example of a cross-sectional structure of the portion along line A-B shown in FIG. 8.

Referring to FIGS. 8 and 9, in some cases, the gate line GL can be formed of the first gate metal GATE1 constituting the first gate electrode GE1 of the first thin film transistor TFT1, or can be made of the second gate metal GATE2 constituting the capacitor electrode CE.

At least one switching transistor SWT can be disposed in the subpixel SP. A part of the switching transistor SWT can be the first thin film transistor TFT1 and the other part can be the second thin film transistor TFT2.

In addition, the driving transistor DRT can be disposed in the subpixel SP, and the driving transistor DRT can be the first thin film transistor TFT1.

The capacitor electrode CE can be disposed on the first gate electrode GE1 of the first thin film transistor TFT1 that is the driving transistor DRT. In addition, the hydrogen adsorption layer HAL can be disposed on at least a portion of the capacitor electrode CE.

The hydrogen adsorption layer HAL can be disposed only on the capacitor electrode CE positioned on the gate electrode of the driving transistor DRT among the electrodes disposed on the subpixel SP.

For example, the hydrogen adsorption layer HAL can be disposed on the capacitor electrode CE on the driving transistor DRT in order to prevent re-hydrogenation of the driving transistor DRT among the first thin film transistor TFT1 during the heat treatment process of the second thin film transistor TFT2. Also, the hydrogen adsorption layer HAL may not be disposed in a region overlapping the switching transistor SWT so as not to affect a change in the characteristics of the switching transistor SWT among the first thin film transistor TFT1.

In addition, the outer edge of the hydrogen adsorption layer HAL can be disposed inside the outer edge of the capacitor electrode CE in a region overlapping with the capacitor electrode CE.

Referring to FIG. 9, at least a portion of the outer portion or outer edge of the hydrogen adsorption layer HAL on the capacitor electrode CE can be located inside the distance d from the outer edge of the capacitor electrode CE. In addition, in some cases, at least a portion of the outer edges of the hydrogen adsorption layer HAL can overlap with the outer edges of the capacitor electrodes CE.

At least a portion of the outer portion of the hydrogen adsorption layer HAL is disposed to be located inside the outer periphery of the capacitor electrode CE. Thus, it is possible to prevent the hydrogen adsorption layer HAL from affecting the change in the driving characteristics of the switching transistor SWT other than the driving transistor DRT.

In addition, the hydrogen adsorption layer HAL may not be disposed on the electrode pattern EPTN disposed on the same layer as the capacitor electrode CE. The electrode pattern EPTN can be, for example, a signal line made of the same material as the capacitor electrode CE and separately disposed from the capacitor electrode CE. Alternatively, the electrode pattern EPTN can be an electrode portion connected to the capacitor electrode CE but not overlapping with the first gate electrode GE1 of the first thin film transistor TFT1.

Since the hydrogen adsorption layer HAL is not disposed on the electrode pattern EPTN other than the capacitor electrode CE, the thickness t2 of the electrode pattern EPTN can be smaller than the thickness t1 of the capacitor electrode CE on which the hydrogen adsorption layer HAL is disposed. In addition, only the driving characteristics of the driving transistor DRT are controlled by the hydrogen adsorption layer HAL, so that the driving characteristics of the switching transistor SWT may not be affected.

The hydrogen adsorption layer HAL is disposed on the capacitor electrode CE positioned on the driving transistor DRT, and can be located on the upper surface or the lower surface of the capacitor electrode CE. In addition, in some cases, the hydrogen adsorption layer HAL can be disposed in a form included in the capacitor electrode CE.

Alternatively, the hydrogen adsorption layer HAL can be located in a region overlapping with the driving transistor DRT, but can be located in a region separated from the capacitor electrode CE.

Figure 10:
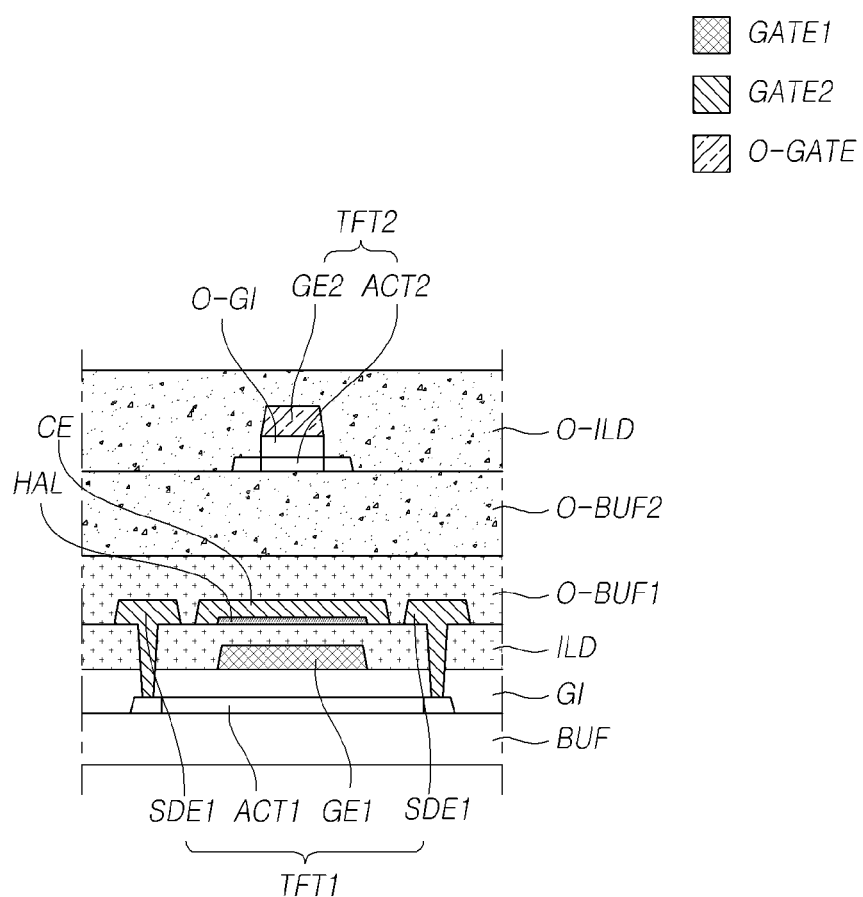
FIGS. 10 to 12 are diagrams illustrating other examples of a cross-sectional structure of a region in which a driving transistor is disposed among thin film transistors included in the display device according to embodiments of the present invention.
Figure 11:
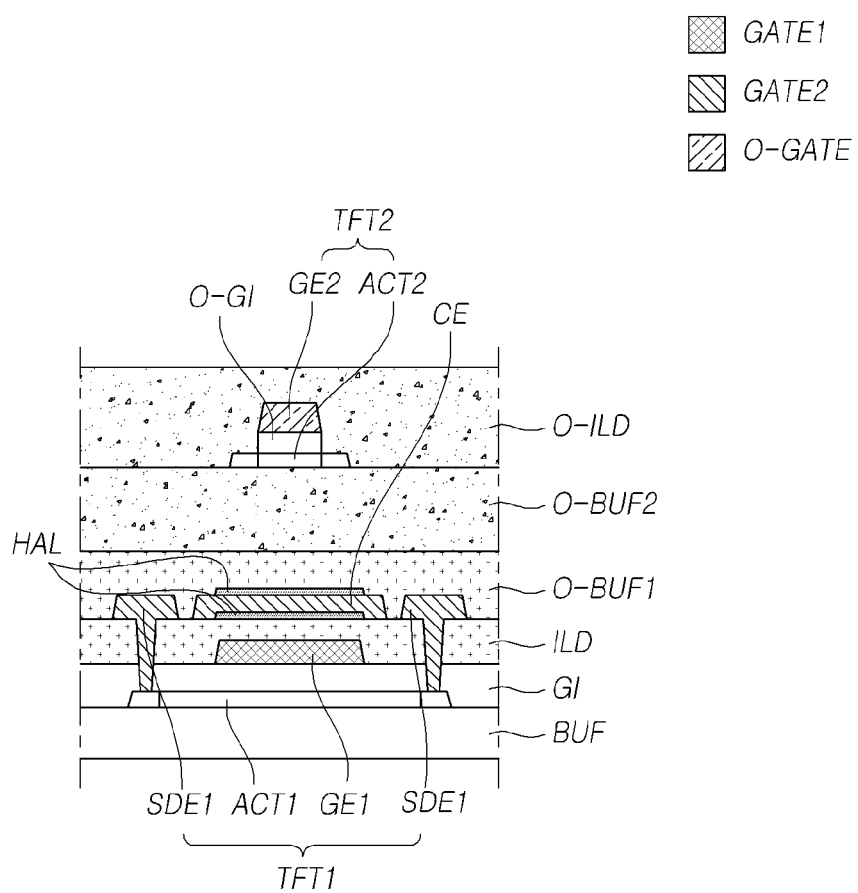
Figure 12:
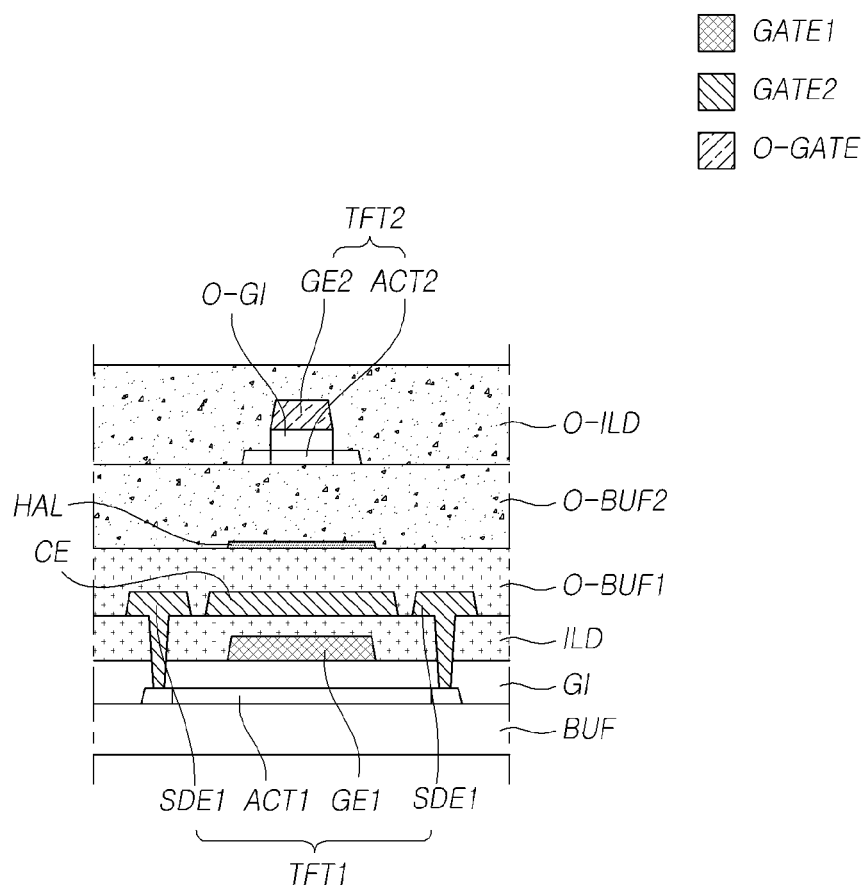

FIGS. 10 to 12 are diagrams illustrating other examples of a cross-sectional structure of a region in which a driving transistor DRT is disposed among thin film transistors TFT included in the display device 100 according to embodiments of the present invention.

Referring to one example shown in FIG. 10, the capacitor electrode CE can be disposed on the first gate electrode GE1 of the first thin film transistor TFT1. In addition, the hydrogen adsorption layer HAL can be disposed on the lower surface of the capacitor electrode CE.

The hydrogen adsorption layer HAL can be disposed on the lower surface of the capacitor electrode CE, and the capacitor electrode CE can be disposed in a form surrounding the hydrogen adsorption layer HAL.

Therefore, it is possible to easily prevent the hydrogen adsorption layer HAL from being located in a region where another first thin film transistor TFT1, such as the switching transistor SWT, is disposed.

In addition, by allowing the hydrogen adsorption layer HAL to be disposed on the interface between the first oxide buffer layer O-BUF1 having the increased hydrogen content and the interlayer insulation layer ILD, it is possible to effectively capture hydrogen moving from the first oxide buffer layer O-BUF1.

In this case, the hydrogen adsorption layer HAL may not be disposed on the first gate electrode GE1 positioned under the capacitor electrode CE. When the hydrogen adsorption layer HAL is disposed on the first gate electrode GE1, the re-hydrogenation of the first active layer ACT1 adjacent to the first gate electrode GE1 can be performed while the hydrogen adsorption layer HAL captures hydrogen.

Accordingly, when the hydrogen adsorption layer HAL is disposed under the capacitor electrode CE for easy placement of the hydrogen adsorption layer HAL and improvement of hydrogen capture performance, the hydrogen adsorption layer HAL can be disposed on the interlayer insulation layer ILD.

In addition, the hydrogen adsorption layer HAL can be disposed on both the upper and lower surfaces of the capacitor electrode CE.

Referring to another example shown in FIG. 11, the hydrogen adsorption layer HAL can be disposed on the upper and lower surfaces of the capacitor electrode CE.

As described above, the hydrogen adsorption layer HAL can be positioned so as not to overlap with a region in which the switching transistor SWT other than the driving transistor DRT is disposed.

Therefore, the area in which the hydrogen adsorption layer HAL is disposed can be equal to or smaller than the area of the capacitor electrode CE. When the arrangement area of the hydrogen adsorption layer HAL is small, hydrogen capture performance can be deteriorated. In this case, the hydrogen adsorption layer HAL can be disposed on both the upper and lower surfaces of the capacitor electrode CE, thereby maintaining the hydrogen capture performance of the hydrogen adsorption layer HAL.

Here, the hydrogen adsorption layer HAL disposed on the lower surface of the capacitor electrode CE can be located on the interlayer insulation layer ILD. For example, even when the hydrogen adsorption layer HAL is disposed on both the upper and lower surfaces of the capacitor electrode CE, the hydrogen adsorption layer HAL may not be directly positioned on the first gate electrode GE1.

In addition, since the hydrogen adsorption layer HAL is for capturing hydrogen moved from the first oxide buffer layer O-BUF1 during the heat treatment process, in some cases, the hydrogen adsorption layer HAL can be positioned adjacent to the first oxide buffer layer O-BUF1, but can be located in a region separated from the capacitor electrode CE.

Referring to still another example shown in FIG. 12, the capacitor electrode CE disposed on the first thin film transistor TFT1 can be made of the second gate metal GATE2 in the same manner as the first source electrode and drain electrode SDE1. In addition, the capacitor electrode CE may not include the hydrogen adsorption layer HAL.

The first oxide buffer layer O-BUF1 and the second oxide buffer layer O-BUF2 can be disposed on the capacitor electrode CE.

The hydrogen adsorption layer HAL can be disposed between the first oxide buffer layer O-BUF1 and the second oxide buffer layer O-BUF2.

Since the hydrogen adsorption layer HAL is disposed on the first oxide buffer layer O-BUF1, hydrogen moved from the first oxide buffer layer O-BUF1 during the heat treatment process for the second active layer ACT2 or the like can be captured by the hydrogen adsorption layer HAL. Therefore, the re-hydrogenation of the first active layer ACT1 can be prevented, and the reduction of the S factor of the driving transistor DRT can be prevented.

In addition, the hydrogen adsorption layer HAL can be disposed in a region that does not deviate from the region overlapping with the capacitor electrode CE. For example, even if the hydrogen adsorption layer HAL is disposed separately from the capacitor electrode CE, the hydrogen adsorption layer HAL can be located in a region overlapping the capacitor electrode CE so as not to be disposed in a region of the switching transistor SWT other than the driving transistor DRT.

In this way, the hydrogen adsorption layer HAL can be disposed on at least one surface of the capacitor electrode CE positioned under the first oxide buffer layer O-BUF1, or on the first oxide buffer layer O-BUF1, thereby the hydrogen adsorption layer HAL can collect or capture the hydrogen transferred from the first oxide buffer layer O-BUF1 during the heat treatment process.

In addition, the hydrogen adsorption layer HAL can be located to overlap the gate electrode of the driving transistor DRT, for example, the channel region so as to prevent the re-hydrogenation of the first active layer ACTT by hydrogen moving from the first oxide buffer layer O-BUF1.

Accordingly, according to embodiments of the present invention, it is possible to prevent the reduction of the S factor of the driving transistor DRT during the heat treatment process, thereby maintaining the S factor required for the driving transistor DRT.

In addition, the hydrogen adsorption layer HAL may not be disposed in the region where the switching transistor SWT is located, so that the S factor of the switching transistor SWT can be reduced during the heat treatment process, thereby the driving characteristics of the switching transistor SWT can be improved.

Therefore, according to embodiments of the present invention, it is possible to provide a display device 100 in which a thin film transistor TFT is implemented, which minimizes the addition of a process and can satisfy different driving characteristics required for each thin film transistor TFT.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device, comprising:
    multiple layers;
    a capacitor on the multiple layers, wherein the capacitor includes one capacitor electrode and another capacitor electrode, wherein the one capacitor electrode is on a layer where a first gate electrode of a first thin film transistor is disposed on, and wherein an electrode disposed on a layer where the another capacitor electrode is disposed on and made of same material with the another capacitor electrode overlaps a second thin film transistor;
    a first planarization layer and a second planarization layer on the first thin film transistor and the second thin film transistor; and
    a source electrode of the first thin film transistor between the first planarization layer and the second planarization layer,
    wherein electrode patterns are disposed under the first planarization layer, and at least one of the electrode patterns is connected to the source electrode, and other one of the electrode patterns is connected to one of the one capacitor electrode and the another capacitor electrode.

2. The display device of claim 1, wherein the first thin film transistor includes an active layer made of polycrystalline silicon, and the second thin film transistor includes an active layer made of oxide semiconductor.

3. The display device of claim 1, wherein the first thin film transistor is a switching transistor.

4. The display device of claim 1, wherein the first thin film transistor is a driving transistor.

5. The display device of claim 1, wherein the first thin film transistor includes an active layer made of polycrystalline silicon, and the first thin film transistor is a driving transistor, and a switching transistor having a same stack structure with the first thin film transistor is disposed adjacent to the first thin film transistor.

6. The display device of claim 1, wherein the multiple layers include a substrate and two or more buffer layers on the substrate.

7. The display device of claim 1, further comprising:
    a bank on the second planarization layer; and
    a spacer on the bank.

8. The display device of claim 7, wherein the spacer is disposed to be away from an upper edge of the bank, and a width of the spacer is smaller than a width of the bank.

9. The display device of claim 1, wherein the one capacitor electrode includes Mo.

10. The display device of claim 1, wherein the another capacitor electrode includes Ti.

11. The display device of claim 1, further comprising:
    a first oxide buffer layer disposed on the first thin film transistor and made of SiNx; and
    a second oxide buffer layer disposed between the first oxide buffer layer and the second thin film transistor, and made of SiO2.

12. The display device of claim 1, further comprising:
    an oxide buffer layer between the first thin film transistor and the second thin film transistor, and made of SiO2.

13. A display device, comprising:
    a plurality of first thin film transistors disposed on multiple layers;
    at least one insulation layer disposed on at least one of the plurality of first thin film transistors;
    a capacitor electrode disposed on the at least one insulation layer, wherein a hydrogen adsorption layer is disposed on at least one of an upper surface or a lower surface of the capacitor electrode;
    at least one oxide buffer layer disposed on the capacitor electrode; and
    a plurality of second thin film transistors disposed on the at least one oxide buffer layer.

14. The display device of claim 13, wherein the hydrogen adsorption layer is disposed in a region overlapping at least a portion of a gate electrode of one of the at least some of the plurality of first thin film transistors.

15. The display device of claim 13, wherein the hydrogen adsorption layer is disposed in a region overlapping at least some of the plurality of first thin film transistors, and the hydrogen adsorption layer is not disposed in a region overlapping remaining of the plurality of first thin film transistors.

16. The display device of claim 13, wherein an area of the hydrogen adsorption layer is equal to or less than an area of the capacitor electrode.

17. The display device of claim 13, wherein at least a portion of outer edges of the hydrogen adsorption layer overlaps outer edges of the capacitor electrode.

18. The display device of claim 13, wherein an outer edge of the hydrogen adsorption layer is located inside an outer edge the capacitor electrode.

19. The display device of claim 13, further comprising a least one electrode pattern that is disposed on a same layer as the capacitor electrode, overlaps at least a portion of remaining of the plurality of first thin film transistors except for some of the plurality of first thin film transistors overlapping the capacitor electrode, and is made of a material other than a material constituting the hydrogen adsorption layer.

20. A display device, comprising:
- a plurality of first thin film transistors disposed on multiple layers;
- a plurality of insulation layers located on one of the plurality of first thin film transistors;
- a plurality of second thin film transistors disposed on one of the plurality of insulation layers;
- a capacitor electrode disposed between at least some of the plurality of first thin film transistors and one of the plurality of insulation layers; and
- a hydrogen adsorption layer positioned between two insulation layers of the plurality of insulation layers and disposed in a portion of a region overlapping the capacitor electrode, wherein the hydrogen adsorption layer is located in a region separated from the capacitor electrode.

* * * * *